(12) United States Patent
Lin et al.

(10) Patent No.: US 9,328,910 B2
(45) Date of Patent: May 3, 2016

(54) ELECTRONIC IMPLEMENT REPLACEMENT STRUCTURE

(71) Applicants: GRT Tech Co., Ltd., New Taipei (TW); Hsuan-Chih Lin, New Taipei (TW); Chun-Cheng Lee, Taichung (TW)

(72) Inventors: Hsuan-Chih Lin, New Taipei (TW); Chun-Cheng Lee, Taichung (TW)

(73) Assignees: GRT TECH CO., LTD., New Taipei (TW); Hsuan-Chih Lin, New Taipei (TW); Chun-Cheng Lee, Taichung (TW)

( * ) Notice: Subject to any disclaimer, the term of this patent is extended or adjusted under 35 U.S.C. 154(b) by 109 days.

(21) Appl. No.: 14/468,967

(22) Filed: Aug. 26, 2014

(65) Prior Publication Data

US 2016/0061435 A1    Mar. 3, 2016

(51) Int. Cl.
| F21V 29/00 | (2015.01) |
| F21V 29/74 | (2015.01) |
| H05K 7/06 | (2006.01) |
| F21Y 101/02 | (2006.01) |

(52) U.S. Cl.
CPC F21V 29/74 (2015.01); H05K 7/06 (2013.01); F21Y 2101/02 (2013.01)

(58) Field of Classification Search
CPC ....... H05K 5/026; H05K 5/02; H05K 5/0247; H05K 5/0221
USPC .......................................... 362/373, 294, 547
See application file for complete search history.

(56) References Cited

U.S. PATENT DOCUMENTS 4,500,946 A   2/1985   Mikola 4,789,343 A *  12/1988   Dougherty ........... B60G 17/015
                                                    439/34
6,597,152 B1 *  7/2003   Jacobs .................. H02J 7/0045
                                                    320/107

(Continued)

FOREIGN PATENT DOCUMENTS

| EP | 2221529 A1 | 8/2010 |
| EP | 2423570 A2 | 2/2012 |
| EP | 2644985 A1 | 10/2013 |
| JP | 2005216527 A | 8/2005 |

OTHER PUBLICATIONS

Search Report of the Corresponding European Patent Application No. 14182206.4 issued on Mar. 5, 2015.

*Primary Examiner* — Ali Alavi
(74) *Attorney, Agent, or Firm* — Chun-Ming Shih; HDLS IPR Services

(57) ABSTRACT

An electronic implement replacement structure includes a housing body (102) and an electronic module (300). The housing body (102) has a base (110) and a connecting ring (120) connected to the base (110). The connecting ring (120) includes press portions (124) and notches (122) spaced apart from one another and respectively disposed between each two adjacent press portion (124). A guiding groove (126) is formed on an outer surface of each of the press portions (124). The electronic module (300) is disposed on the base (110) and corresponding to the connecting ring (120). The electronic module (300) includes an electronic unit (310) and a rotatable ring (330) enclosing the electronic unit (310). An inner wall of the rotatable ring (330) has a sliding block (332) correspondingly and rotatably engaged with the guiding groove (126). Therefore, assembling and disassembling can be achieved without any tools.

11 Claims, 13 Drawing Sheets

(56) References Cited

U.S. PATENT DOCUMENTS

| | | | | |
|---|---|---|---|---|
| 7,866,850 B2 * | 1/2011 | Alexander | F21V 19/001 | 362/147 |
| 7,989,969 B2 * | 8/2011 | Grant | F02B 63/04 | 290/1 A |
| 8,152,336 B2 * | 4/2012 | Alexander | F21V 15/01 | 362/147 |
| 8,558,413 B1 * | 10/2013 | Lepard | F21V 33/0052 | 307/150 |
| 8,967,837 B2 * | 3/2015 | Tsuei | F21K 9/135 | 362/235 |
| 9,142,992 B2 * | 9/2015 | Malackowski | H01M 2/1055 | |
| 2012/0236563 A1 * | 9/2012 | Breidenassel | F21V 17/12 | 362/249.02 |
| 2013/0088876 A1 * | 4/2013 | Harbers | F21V 29/00 | 362/294 |
| 2014/0043817 A1 * | 2/2014 | Zhang | F21S 2/005 | 362/249.02 |
| 2014/0153277 A1 * | 6/2014 | Lai | F21K 9/30 | 362/558 |
| 2014/0160772 A1 * | 6/2014 | Wu | F21S 8/026 | 362/373 |

* cited by examiner

ELECTRONIC IMPLEMENT REPLACEMENT STRUCTURE

BACKGROUND

1. Technical Field

The present invention relates to a replacement structure and, in particular, to an electronic implement replacement structure in a modular design.

2. Related Art

Conventional road lighting equipments utilize a mercury lamp or a sodium lamp as a light source which illuminates a wider illumination zone but consumes more power, cannot be recycled, and therefore is not environmentally friendly. In recent years, the technology of a light emitting diode (LED) is increasingly developed. The LED has advantages such as high luminance, power-saving, environmental friendliness, a long life span, so has been widely used for lamp lighting and then used for road lighting.

When a street lamp malfunctions, it has to be repaired immediately in order to protect safety of passers-by. In general, a repairman has to use an elevated work platform (such as a cherry picker) in order to replace or repair the street lamp. However, most malfunction conditions of conventional street lamps are scenarios in which a power supply device or a sensor controlling on-and-off of the LED street lamp is damaged or malfunctioning. The repairman has to remove a lampshade of an LED street lamp, and then replace a whole set of the lamp street structure. Therefore, such a maintenance method not only wastes time but also increases maintenance costs.

There is already an electronic implement replacement structure in the market, in which an outer thread disposed on a light source structure and an inner thread disposed in the lampshade are screwed together to assemble the light source structure and the lampshade. However, in practice, during the assembly process, it is not easy to make the outer and inner threads cooperatively engaged, thus causing inconvenience in assembling the light source structure and the lampshade.

In view of the foregoing, the inventor made various studies to improve the above-mentioned problems to realize the improvements by inventing an electronic implement replacement structure.

BRIEF SUMMARY

It is an object of the present invention to provide an electronic implement replacement structure, in which assembling, disassembling and replacing can be achieved without any tools.

Accordingly, the present invention provides an electronic implement replacement structure including a housing body and an electronic module. The housing body has a base and a connecting ring connected to the base. The connecting ring includes a plurality of press portions and a plurality of notches spaced apart from one another and respectively disposed between each two adjacent press portions. A guiding groove is formed on an outer surface of each of the press portions. The electronic module is disposed on the base and corresponding to the connecting ring. The electronic module includes an electronic unit and a rotatable ring enclosing the electronic unit. An inner wall of the rotatable ring has a sliding block correspondingly and rotatably engaged with the guiding groove.

The present invention also has the following effects: after the electronic module is in alignment with the base, it only requires inserting the electronic module into the base and rotating the electronic module by a small angle, and then the assembly can be achieved fast and stably. Therefore, even an ordinary consumer can finish assembling or disassembling in a simple and efficient way. Furthermore, the preset invention has a wide application field which including the street lamp structure but not limited thereto. Moreover, in the electronic unit of the present invention, the LED lamp can be replaced by a surveillance camera such as a CCD/CMOS camera, the electronic unit can also include the surveillance camera and the LED lamp at the same time, and the present invention is not limited to the street lamp structure.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
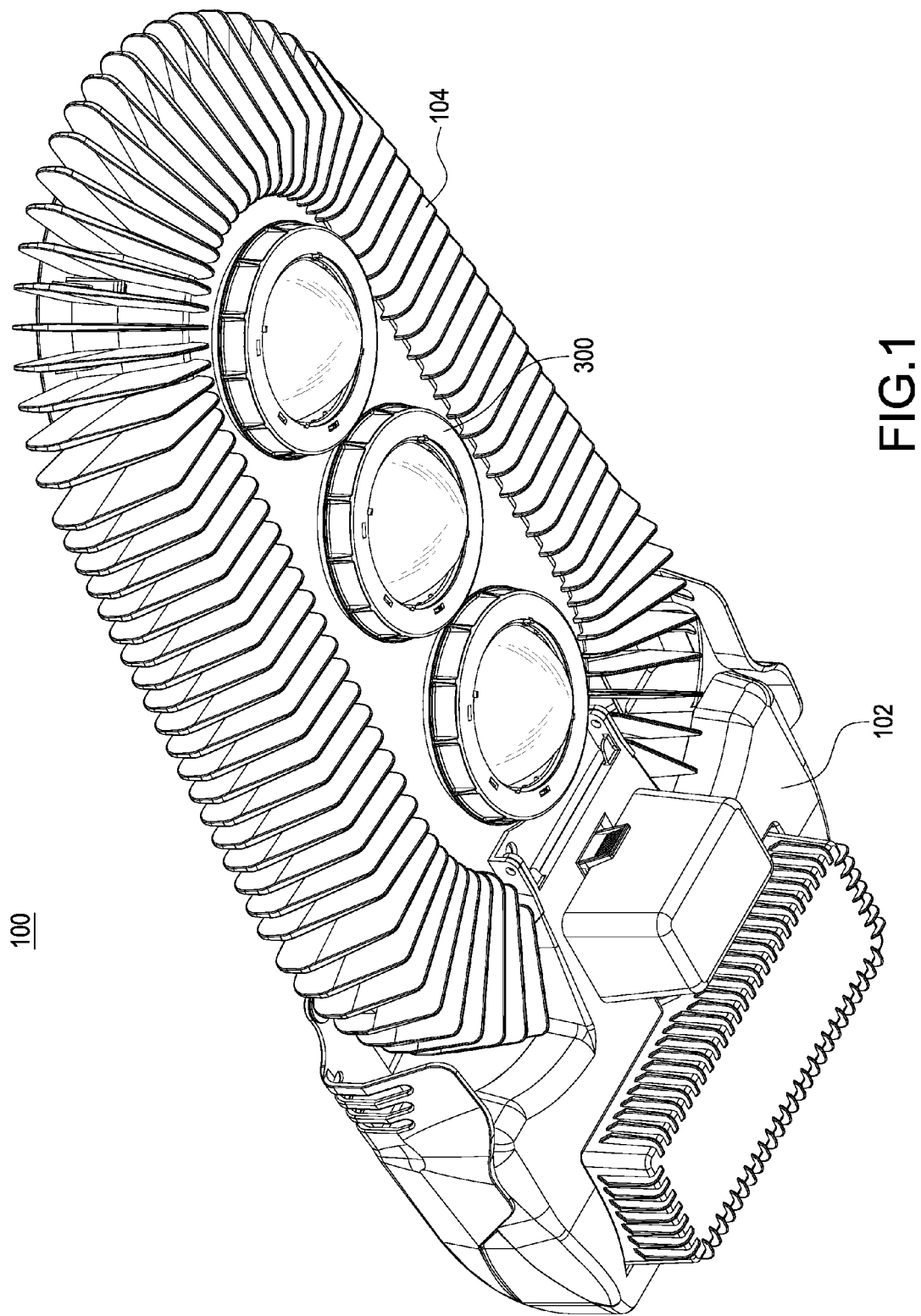
FIG. 1 is a perspective view of an electronic implement replacement structure according to one embodiment of the present invention.
Figure 2:
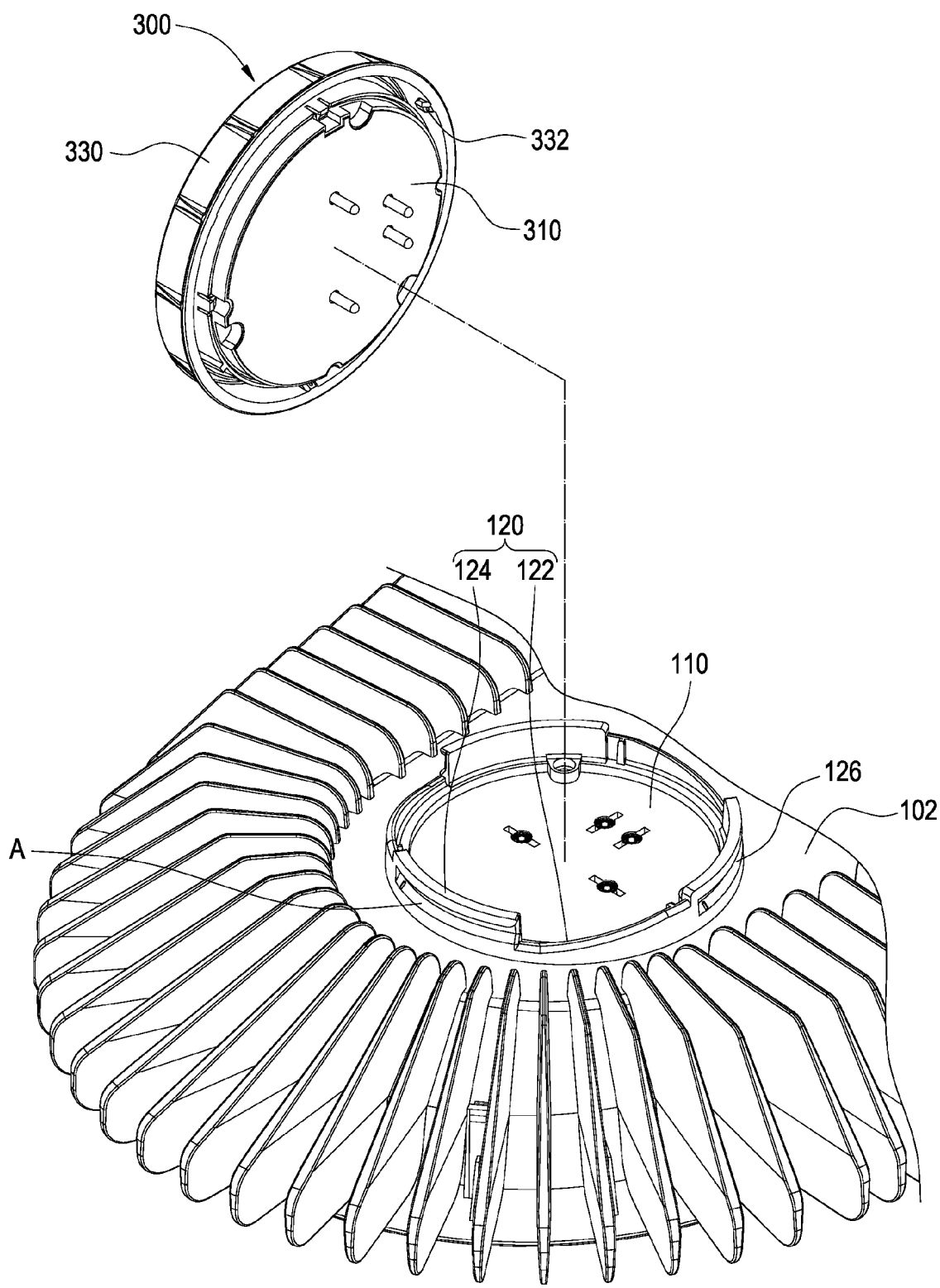
FIG. 2 is a partially exploded view of FIG. 1.

Referring to FIGS. 1 and 2, the present invention provides an electronic implement replacement structure 100 which comprises a housing body 102 and an electronic module 300. The electronic module 300 herein is preferably a light emitting diode (LED) lamp. If the electronic module 300 is the LED lamp, the housing body 102 further has a plurality of radiating fins 104 around the electronic module 300, so as to conduct heat to outside the housing body 102. However, in different embodiments, the electronic module may also be a surveillance camera such as a charge coupled device (CCD) camera or a complementary metal oxide semiconductor (CMOS) camera.

As shown in FIG. 2, the housing body 102 includes a base 110 and a connecting ring 120 connected to the base 110. The connecting ring 120 includes a plurality of press portions 124 and a plurality of notches 122 spaced apart from one another and respectively disposed between each two adjacent press portions 124. According to the present embodiment, preferably the connecting ring 120 is ring-shaped, consists of plastic or metal, and is fixed on the housing body 102 by screws (not illustrated), wherein each of the notches 122 and the press portions 124 is equidistant from one another on the ring shaped connecting ring 120. In another preferable embodiment, the connecting ring 120 can also be integrally formed with the housing body 102. According to the present embodiment, the ring-shaped connecting ring 120 is divided into 6 parts by every notch 122 and press portion 124, and each part of the ring-shaped connecting ring 120 is substantially 60 degrees (central angle). However, in different embodiments, the ring-shaped connecting ring 120 can be divided into four parts by every notch 122 and press portion 124, and each part of the ring-shaped connecting ring 120 is substantially 90 degrees (central angle).

It should be noted that, the connecting ring 120 of the present embodiment consists of plastic or metal and is fixed to the periphery of the base 110 by screws or other components. If the connecting ring 120 is damaged or malfunctions accidentally, the connecting ring 120 can be detached and replaced fast, thus facilitating repairing or assembling of the electronic module 300.

A guiding groove 126 is formed on an outer surface of each of the press portions 124. The guiding groove 126 is adjacent to each of the notches 122, the guiding groove 126 and a surface of the housing body 102 together include an inclined angle A. An inclination direction of the inclined angle A is from away from a surface of the housing body 102 gradually toward the surface of the housing body 102. That is to say, the direction of the guiding groove 126 is inclined from upper right to bottom left. As shown in FIG. 2, the notch 122 similarly has the inclined angle A, and thereby the electronic module 300 is in alignment with the notch 122 and quickly guided into the guiding groove 126. On the contrary, to disassemble the electronic module 300 from the base 110, the notch 122 having the inclined angle A can successfully make the electronic module 300 detach from the base 110 in a vertical direction. Thereby, the assembly and disassembly operation can prevent damaging an electric signal connector (like a conductive terminal 312 shown in FIG. 12) of the electronic module 300.

Figure 3:
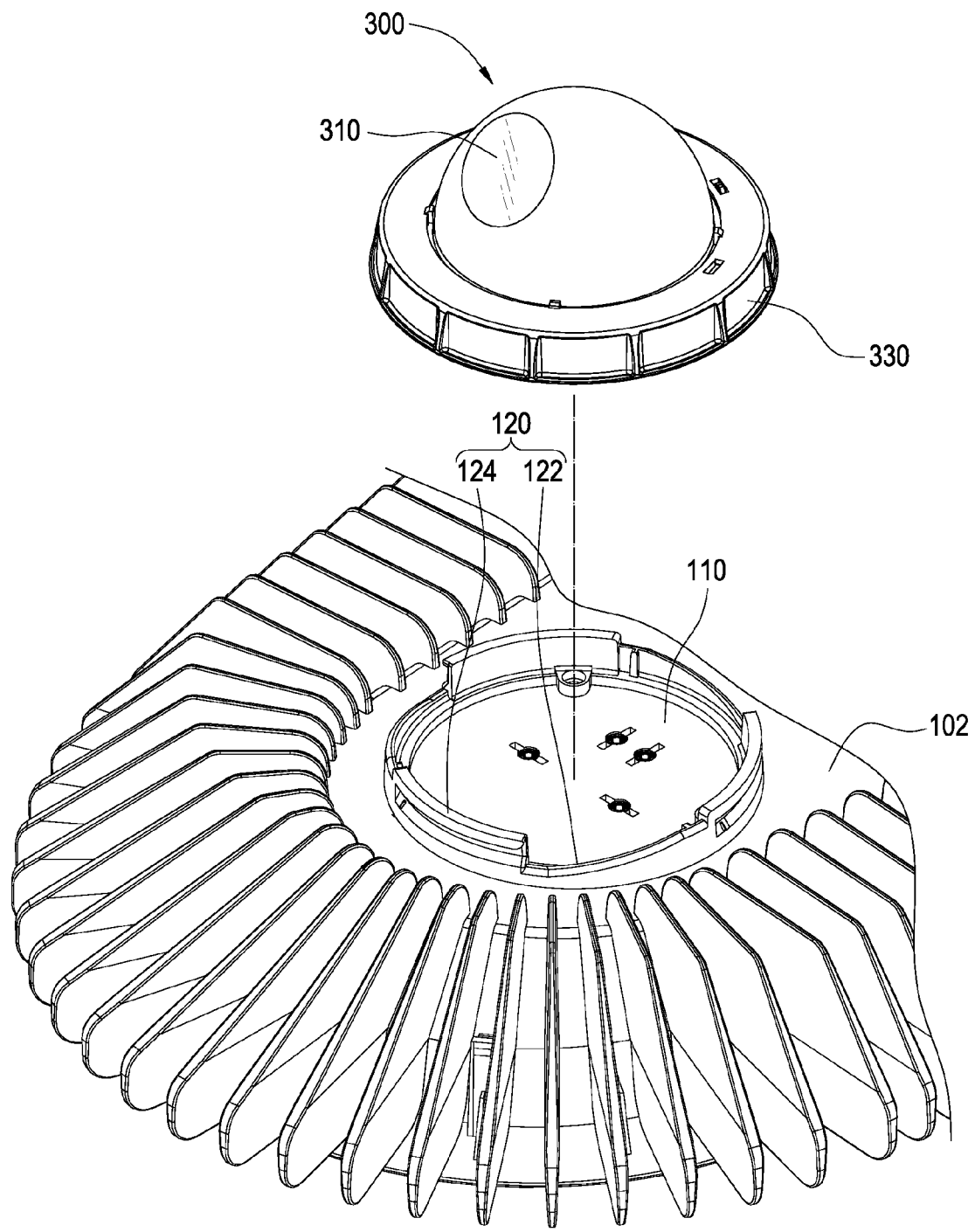
FIG. 3 is a schematic view according to another embodiment of FIG. 2.

The electronic module 300 disposed on the base 110 and corresponding to the connecting ring 120. The electronic module 300 includes an electronic unit 310 and a rotatable ring 330 enclosing the electronic unit 310. In the embodiment shown in FIG. 2, the electronic unit 310 is preferably the LED lamp, and its structure will be described afterward. However, in the embodiment shown in FIG. 3, the electronic unit 310 can be CCD, CMOS, or other suitable photosensitive elements. An inner wall of the rotatable ring 330 has a sliding block 332 correspondingly and rotatably engaged with the guiding groove 126.

Referring to FIGS. 4 to 7, the electronic module 300 further includes a joining element 320 and an elastic positioning portion 322. The joining element 320 is hollow and has some integrally-formed fastening portions 324 to engage corresponding recesses 317, so as to position and fix the joining element 320 on the electronic unit 310. The joining element 320 has some hook portions 328 on the other lateral edge opposite to the fastening portions 324. Each hook portion 328 hooks an inner edge of an open hole of the rotatable ring 330, so as to restrict a movement of the rotatable ring 330 along an axial direction. The elastic positioning portion 322 elastically reciprocate on a circular-arc-shaped surface of the joining element 320, which allows visual inspection of the rotatable ring 330 to determine whether it is rotated to a locked state.

Figure 4:
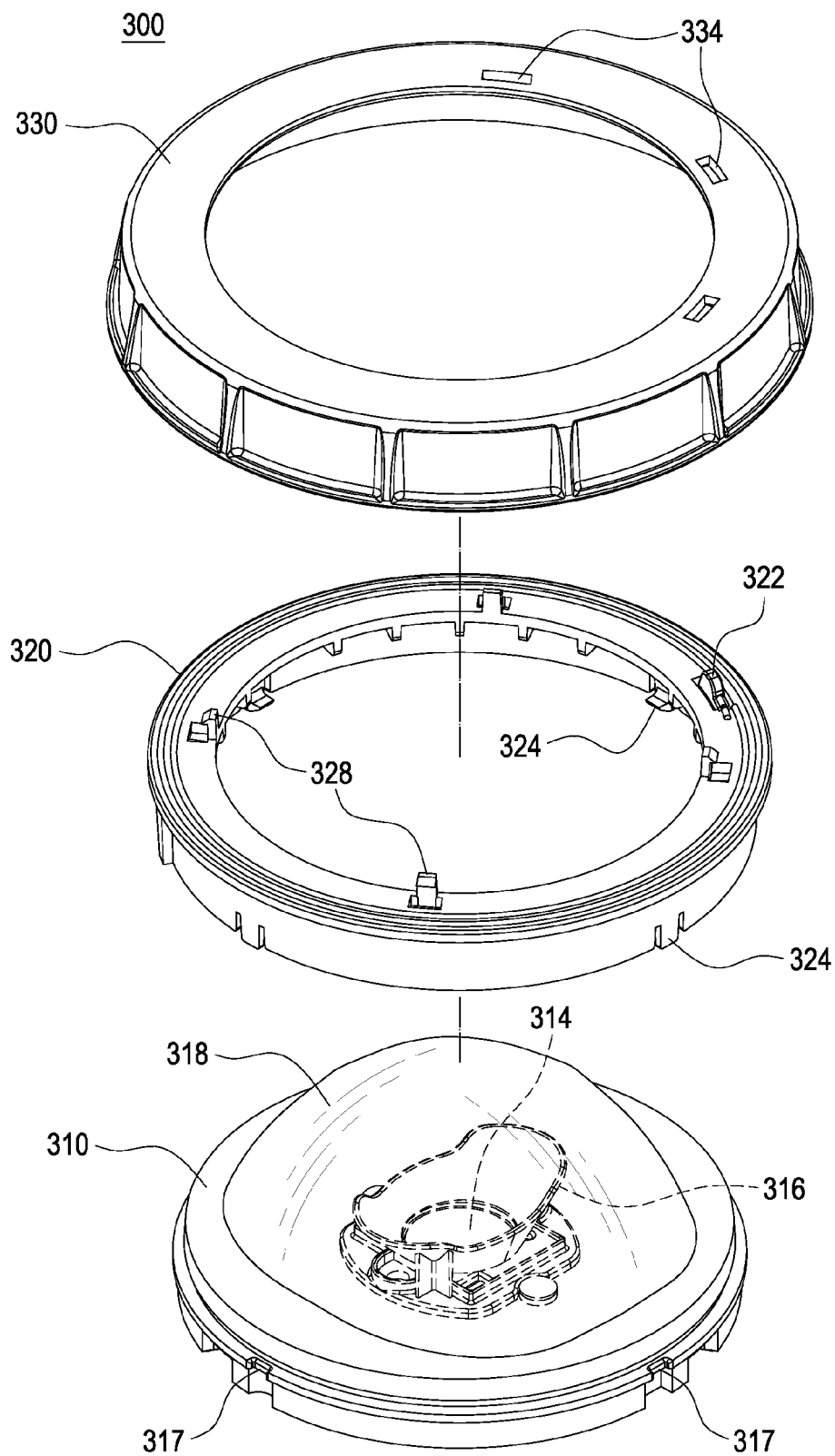
FIG. 4 is a schematic exploded view of an electronic module according to the present invention.
Figure 5:
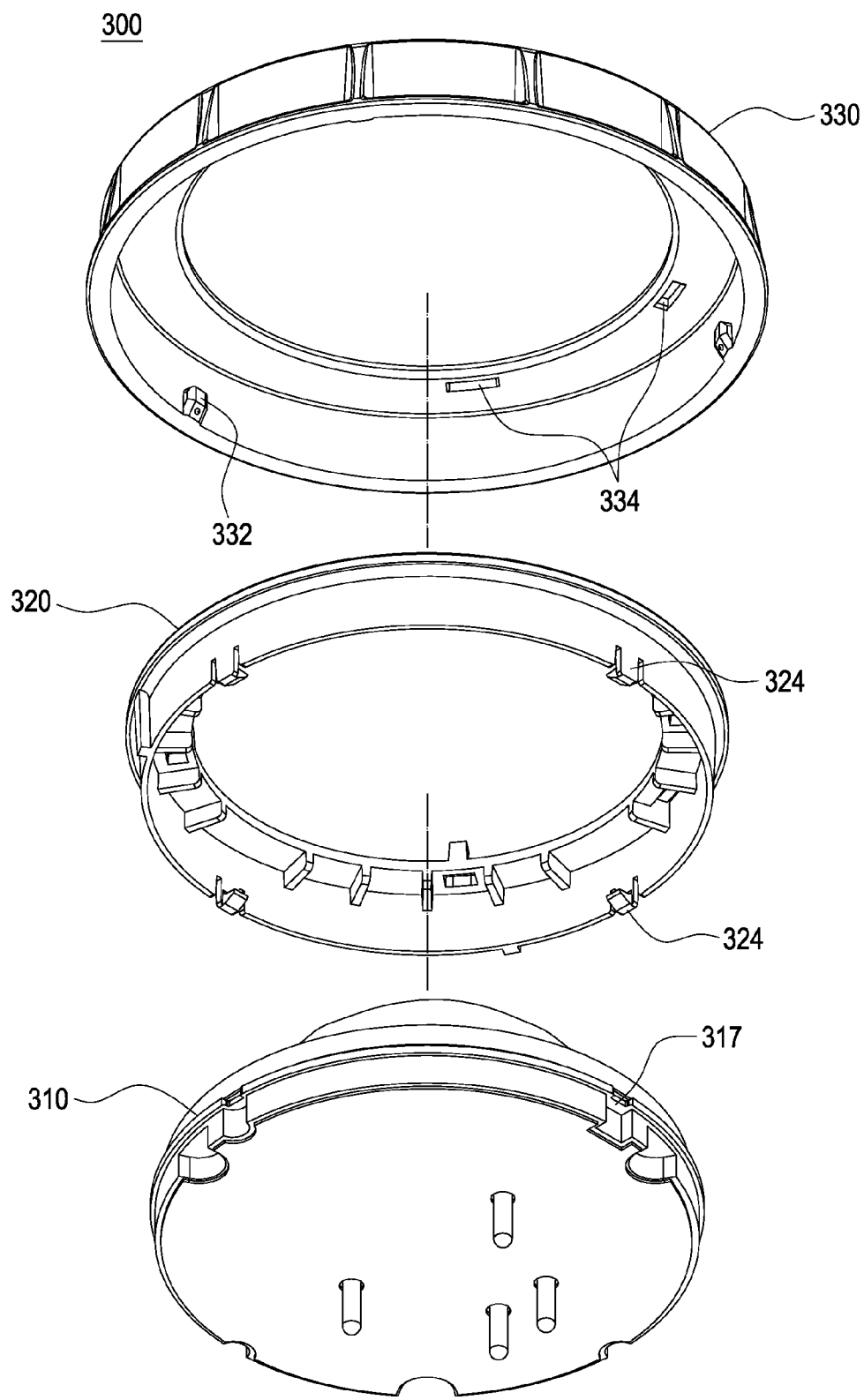
FIG. 5 is a schematic exploded view, from another viewing angle, of the electronic module according to the present invention.
Figure 6:
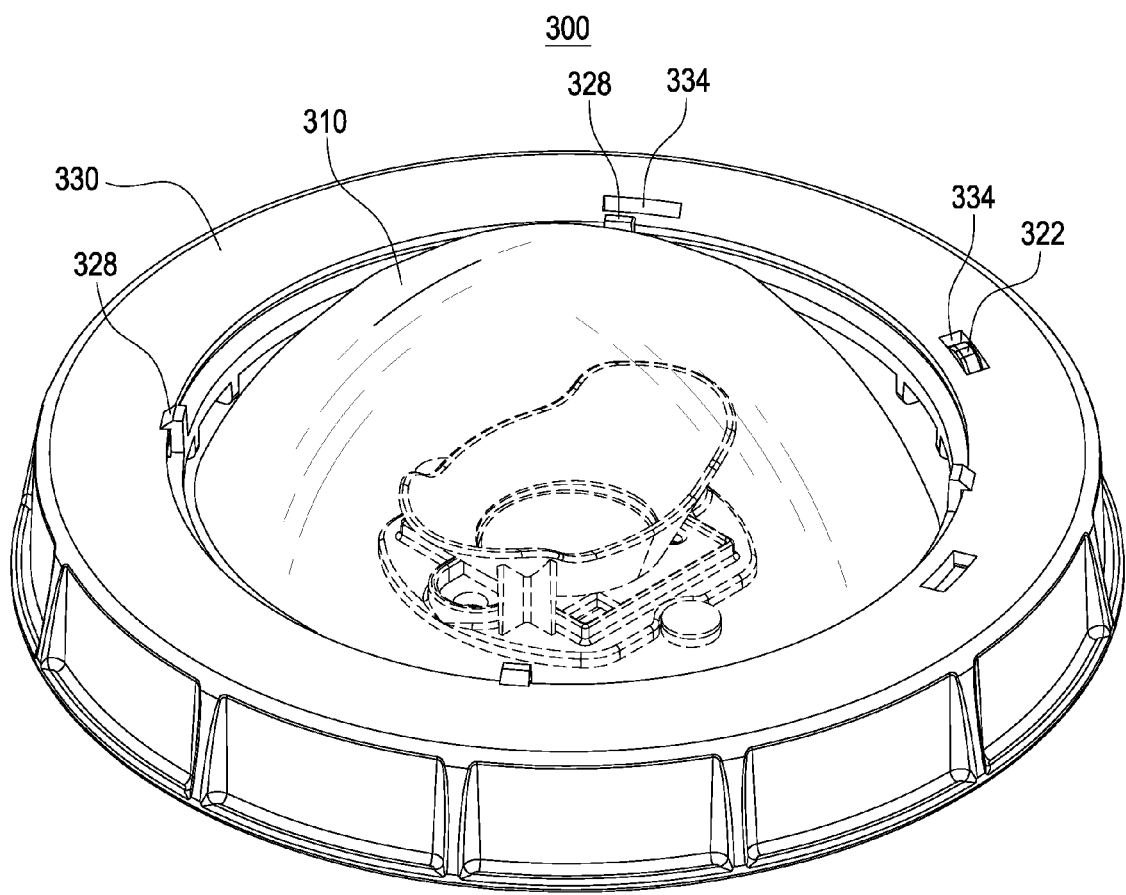
FIG. 6 is a perspective view illustrating an assembled state of the electronic module according to the present invention.
Figure 7:
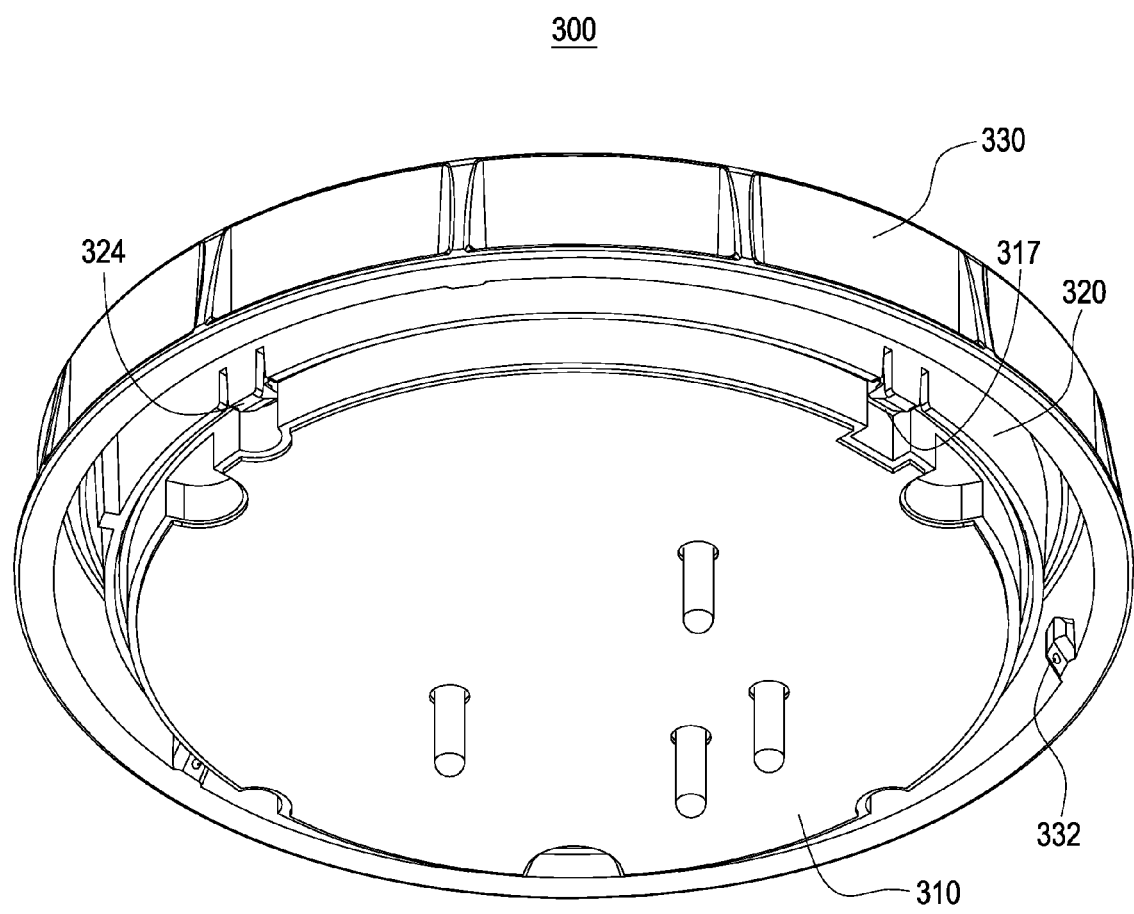
FIG. 7 is a perspective view illustrating an assembled state, from another viewing angle, of the electronic module according to the present invention.

Referring to FIG. 4 and FIG. 6, an outer surface of the rotatable ring 330 further forms a plurality of openings 334, and the elastic positioning portion 322 is disposed corresponding to the opening 334. When the rotatable ring 330 rotates, the hook portion 328 restricts the movement of rotatable ring 330 along the axial direction, but does not affect the rotation of the rotatable ring 330. Furthermore, when the rotatable ring 330 rotates, the elastic positioning portion 322 moves from one of the openings 334 to engage adjacent or corresponding another one of the openings 334. The location of each opening 334 is designed according to a rotation distance of the guiding groove 126 on the press portion 124, which is for example 90 degrees or 60 degrees and varies according to requirements or designs.

Figure 10:
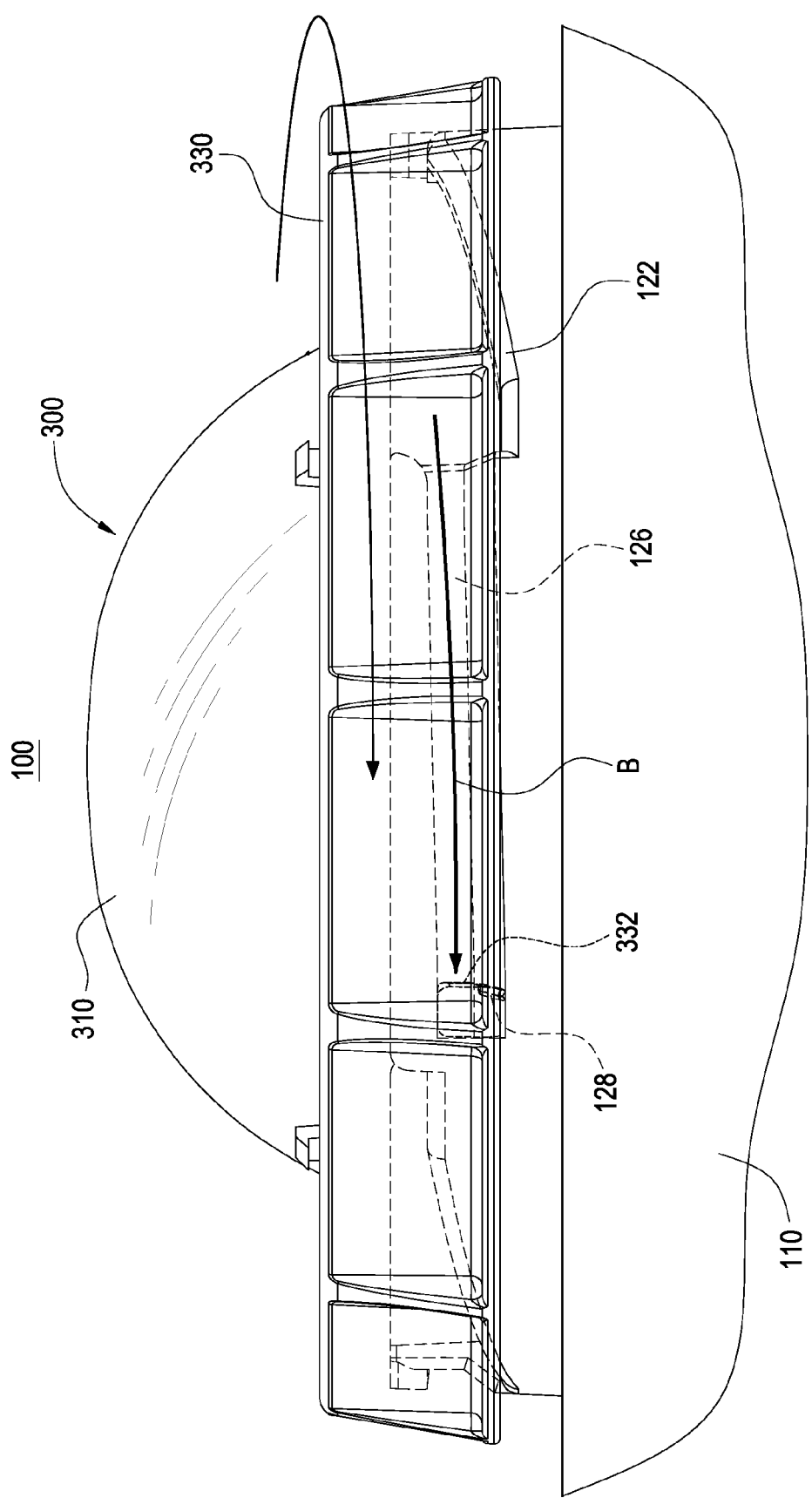
FIG. 10 is still another assembly operational view according to FIG. 9, which is a perspective view illustrating a state that a sliding block is rotated to a determined angle.
Figure 11:
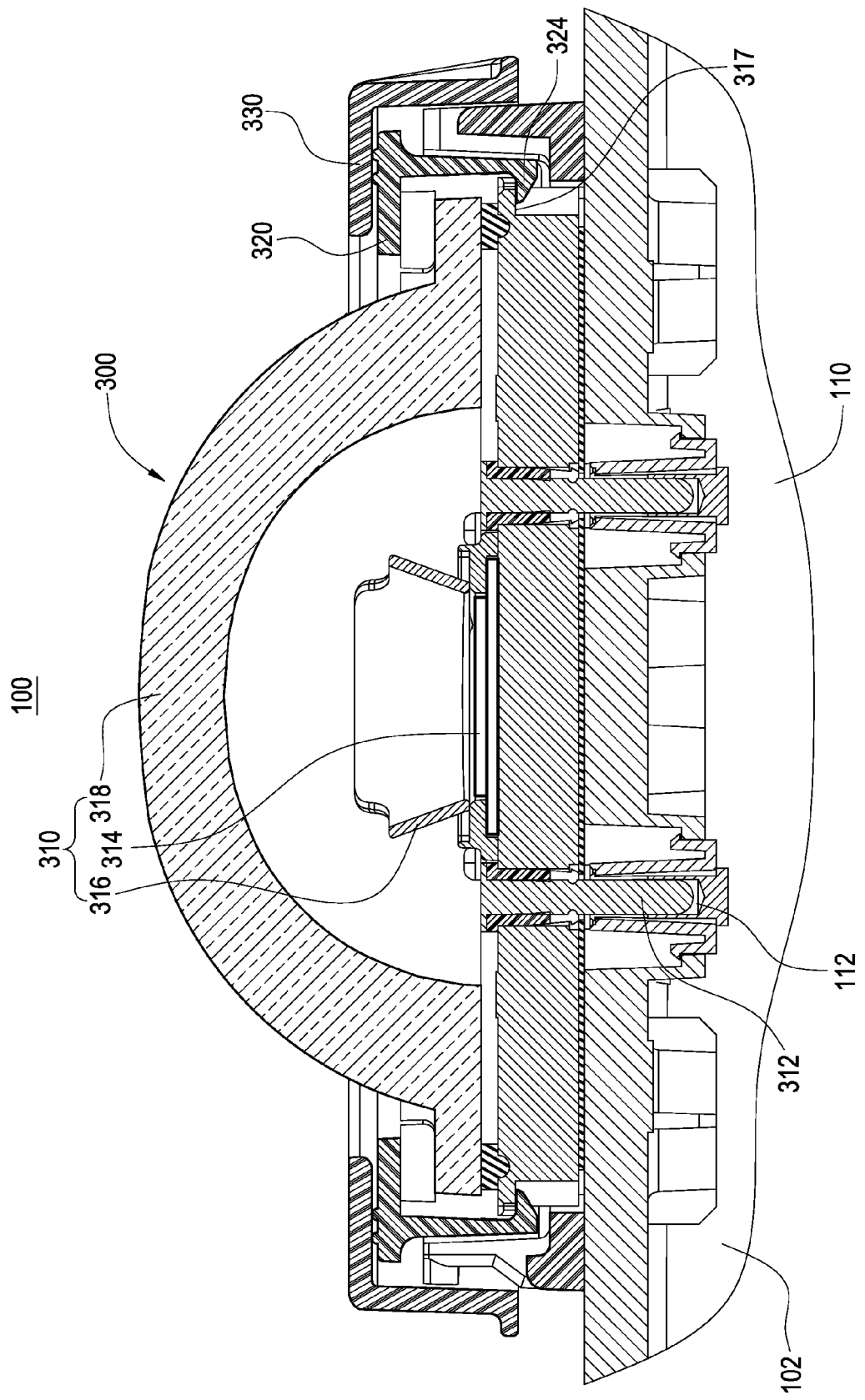
FIG. 11 is a cross-sectional view of FIG. 10.

Referring to FIGS. 8 to 11, detailed descriptions are provided hereinafter to explain how the electronic module 300 is assembled to the base 110. To assemble the electronic module 300, at first the repairman makes the electronic module 300 be in alignment with the base 110. In other words, each conductive terminal 312 of the electronic unit 310 is inserted into a corresponding slot 112 of the base 110 in order to make an electrical connection, as shown in FIG. 11. At this point, the sliding block 332 of the electronic module 300 enters into a corresponding one of the notches 122. When the rotatable ring 330 rotates, the sliding block 332 slides along the guiding groove 126 and rotates by an angle B to make the electronic module 300 positioned on the base 110 at last.

Figure 8:
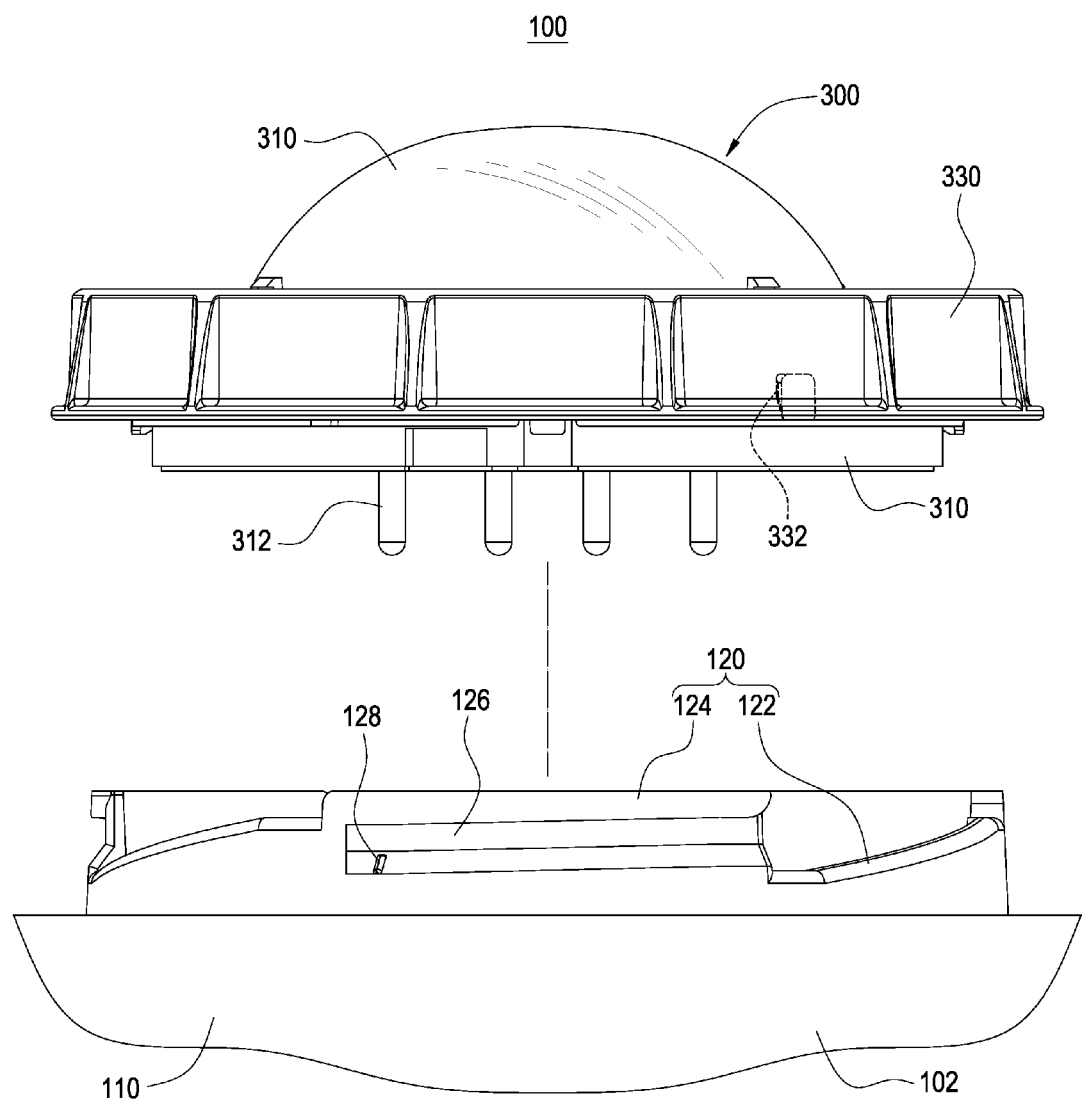
FIG. 8 is a schematic assembly operational view illustrating assembling the electronic module to a base according to the present invention.
Figure 9:
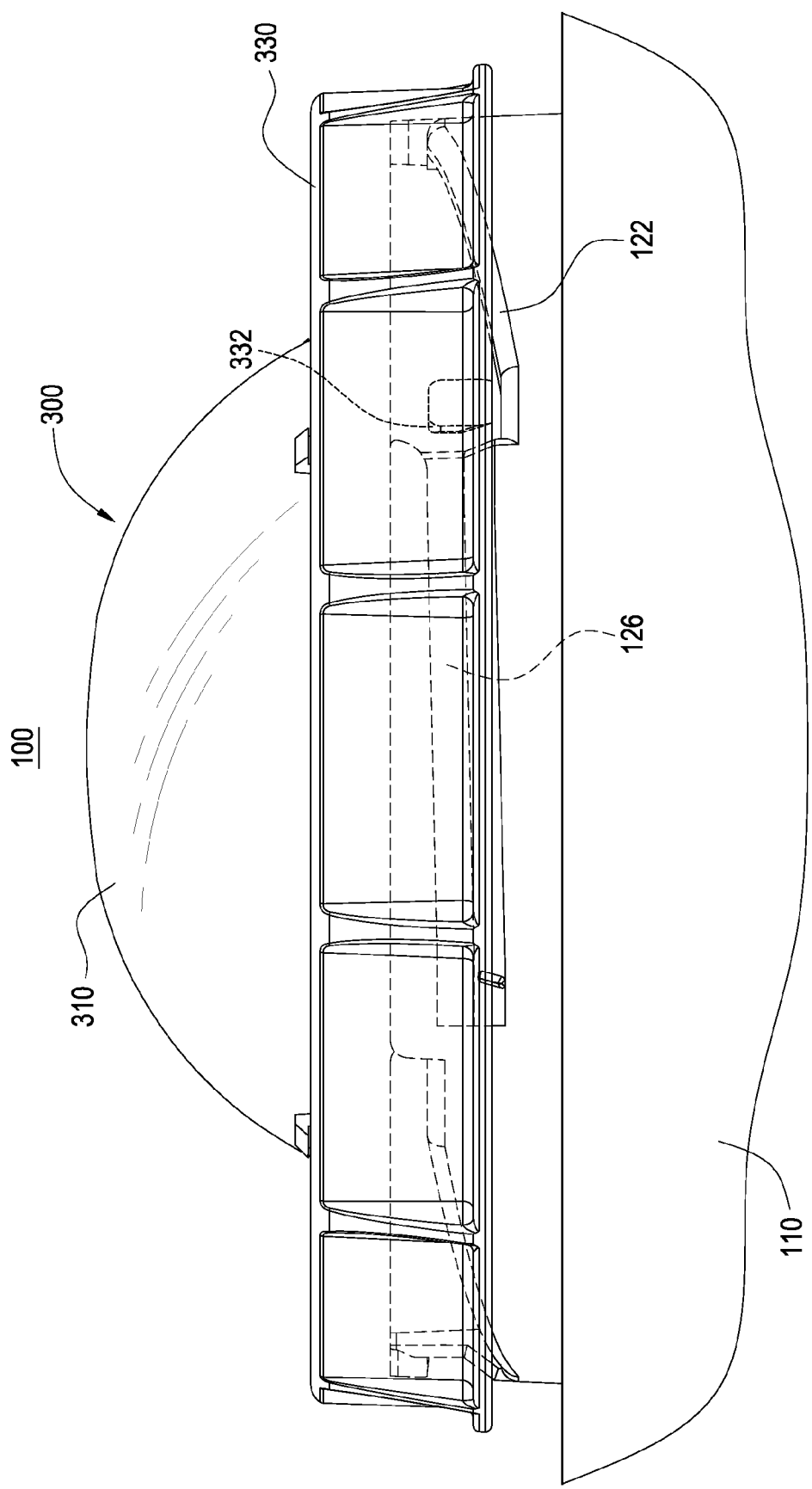
FIG. 9 is another assembly operational view according to FIG. 8.

According to the embodiment shown in FIGS. 8 and 10, an end surface of the guiding groove 126 further has a protruding portion 128 for engagement with the sliding block 332, such that the electronic module 300 is engaged on the base 110. The angle B hereinbefore is preferably 60 degrees. In other words, a central angle of each press portion 124 (guiding groove 126) on the connecting ring 120 is around 60 degrees. However, in different embodiments, the angle B can be around 90 degrees, namely a central angle of each press portion 124 on the connecting ring 120 is around 90 degrees. Since the angle B required to fasten tightly is very small, even an ordinary consumer can assemble the electronic module 300 to the base 110 fast and efficiently without any tools.

As clearly appears in FIG. 11, the electronic module 330 is the LED lamp. That is to say, the electronic unit 310 of the electronic module 300 consists of the conductive terminal 312, an LED 314, a plastic cup 316, lens 318, related circuits (not illustrated), and other components. The related components belong to conventional techniques and thus a repetitive description thereof is omitted herein.

Figure 12:
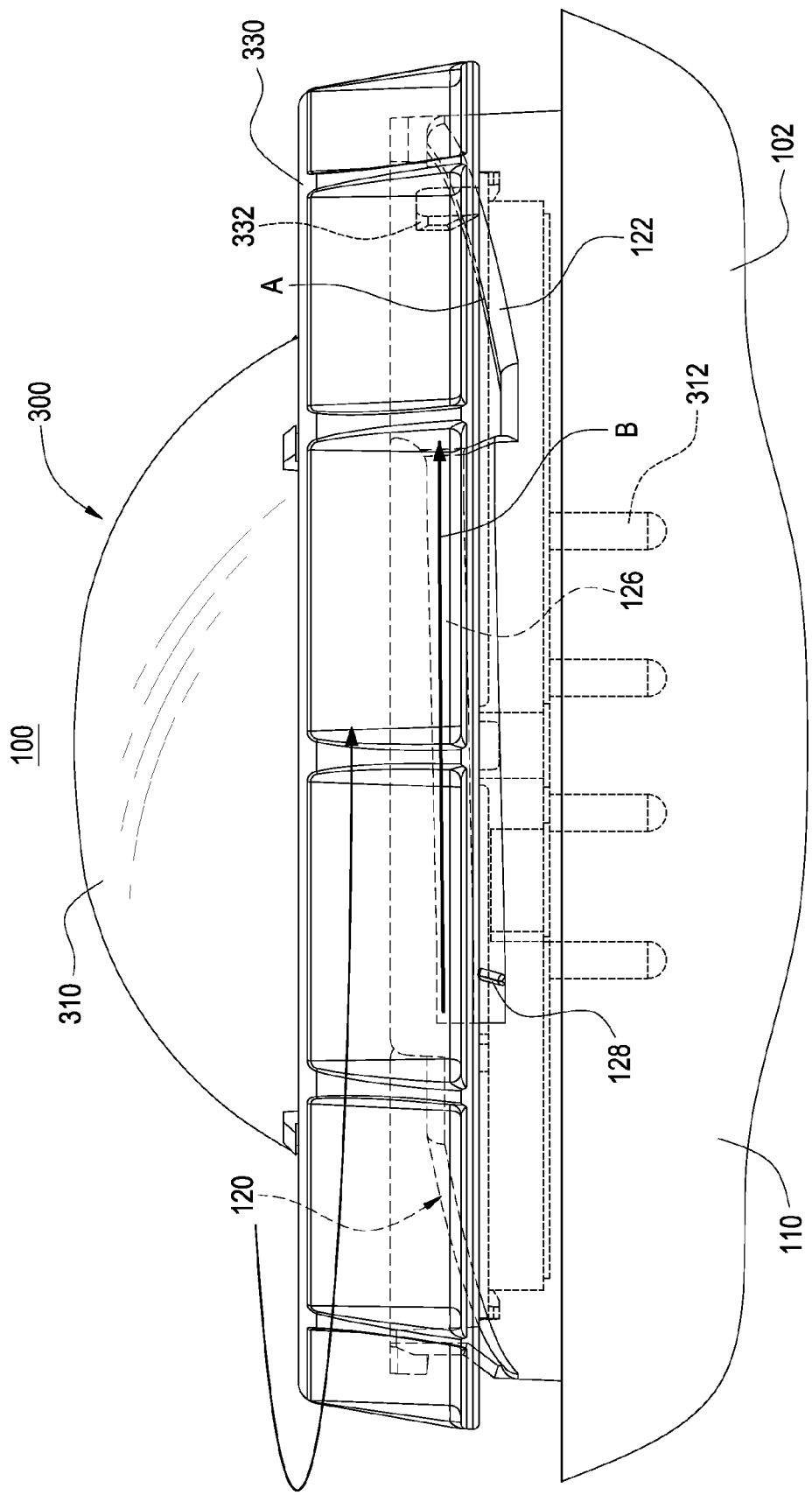
FIG. 12 is a schematic assembly operational view illustrating disassembling the electronic module of the electronic implement replacement structure from the base according to the present invention.
Figure 13:
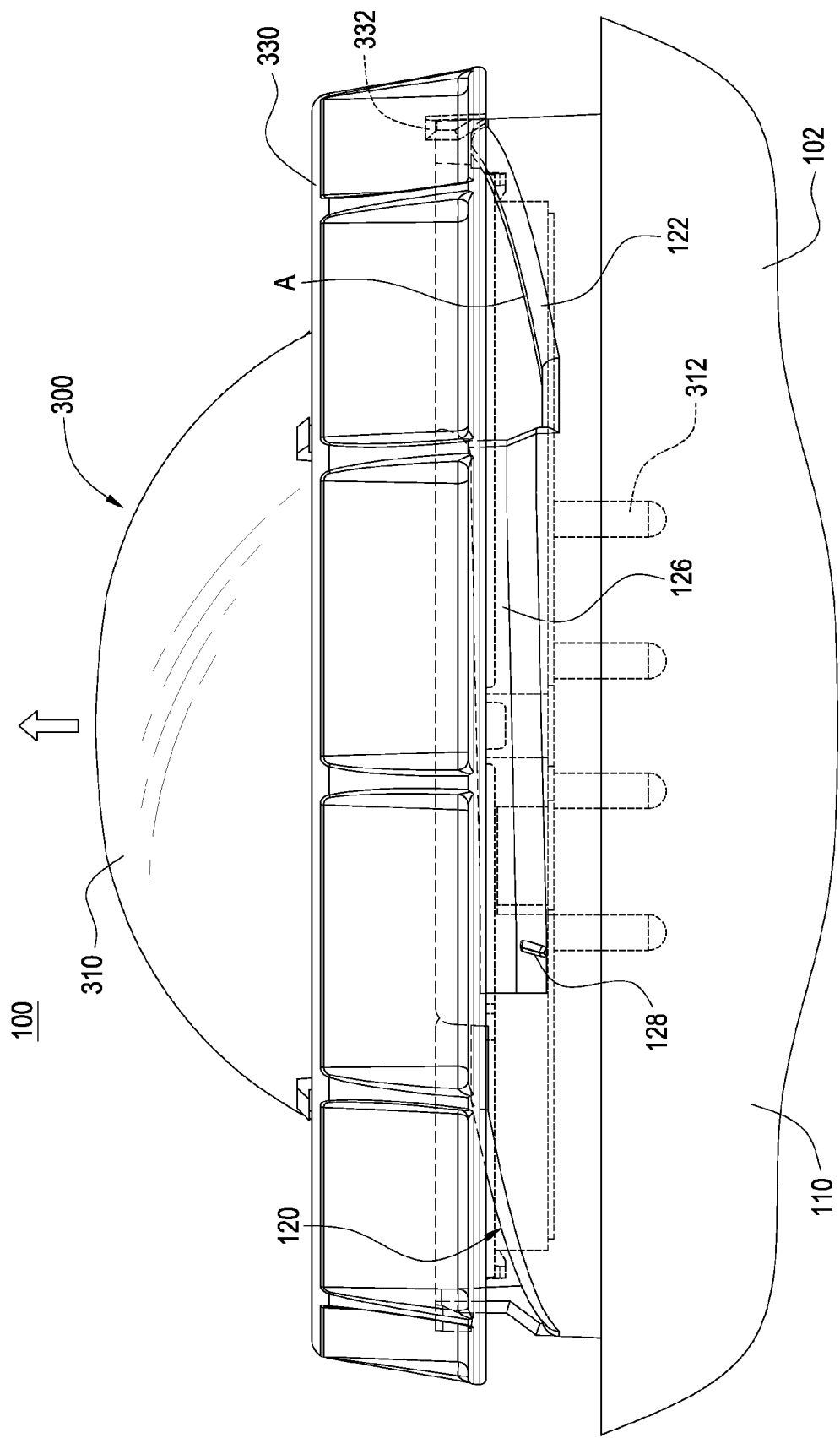
FIG. 13 is another operational view according to FIG. 12, which is a schematic view illustrating a state that conductive terminals of the electronic module are partially detached from the base.

Referring to FIGS. 12 and 13, to disassemble the electronic module 300 from the base 110, the repairman rotates the rotatable ring 330 at first, to make the sliding block 332 of the rotatable ring 330 detached from the protruding portion 128 of the guiding groove 126, until the sliding block 332 slides to the notch 122 of the connecting ring 122 (i.e. rotating by the angle B). When the sliding block 332 of the rotatable ring 330 gradually slides to the highest of the notch 122, owing to the design of the inclined angle A of the notch 122, the electronic module 300 is gradually detached from the base 110 in a vertical direction. Referring to FIG. 13, the conductive terminal 312 of the electronic module 300 is removed by the connecting ring 120 from the base 110 of the housing body 102. Finally, the conductive terminal 312 of the electronic module 300 is entirely detached from the slot 112 of the base 110 to complete the disassembly operation.

Therefore, to disassemble the electronic module 300, the angle B by which the rotatable ring 330 rotate to disassemble the electronic module 300 is very small. Thus, the repairman can disassemble the electronic module 300 from the base 110 fast and efficiently without any tools, thereby preventing damaging the conductive terminals 312 of the electronic module 300.

In summary, the electronic implement replacement structure of the present invention certainly can achieve the anticipated objects and improve the defects of conventional techniques, and has novelty and non-obviousness, so the present invention completely meet the requirements of patentability. Therefore, a request to patent the present invention is filed according to patent laws. Examination is kindly requested, and allowance of the present application is solicited to protect the rights of the inventor.

What is claimed is:

1. An electronic implement replacement structure, comprising:
   a housing body including a base and a connecting ring connected to the base, the connecting ring including a plurality of press portions and a plurality of notches spaced apart from one another and respectively disposed between each two adjacent press portions, a guiding groove being formed on an outer surface of each of the press portions; and
   an electronic module disposed on the base and corresponding to the connecting ring, the electronic module including an electronic unit and a rotatable ring enclosing the electronic unit, an inner wall of the rotatable ring having a sliding block correspondingly and rotatably engaged with the guiding groove.

2. The electronic implement replacement structure of claim 1, wherein each of the notches and the press portions is equidistant from one another on the connecting ring.

3. The electronic implement replacement structure of claim 1, wherein the guiding groove is adjacent to each of the notches, the guiding groove and a surface of the housing body together include an inclined angle, and an inclination direction of the inclined angle is from away from the surface of the housing body gradually toward the surface of the housing body.

4. The electronic implement replacement structure of claim 3, wherein the notch includes the inclined angle, such that the sliding block of the electronic module is in alignment with the notch and enters into the guiding groove.

5. The electronic implement replacement structure of claim 1, wherein an end surface of the guiding groove has a protruding portion for engaging the sliding block.

6. The electronic implement replacement structure of claim 1, wherein the electronic module further comprises a joining element and an elastic positioning portion, the joining element is provided for fixing the electronic module, an outer surface of the rotatable ring further forms a plurality of openings, and the elastic positioning portion is disposed corresponding to the opening.

7. The electronic implement replacement structure of claim 6, wherein the sliding block of the rotatable ring is further correspondingly and rotatably engaged with the guiding groove by an angle, and the elastic positioning portion is movable from one of the openings to engage an adjacent or corresponding another one of the openings.

8. The electronic implement replacement structure of claim 7, wherein the magnitude of the angle includes 60 degrees or 90 degrees.

9. The electronic implement replacement structure of claim 1, wherein a plurality of slots are formed in the base, the electronic unit further has a plurality of conductive terminals for insertion into the slots.

10. The electronic implement replacement structure of claim 1, wherein the electronic module includes one of a light emitting diode lamp, a charge coupled device, or a complementary metal oxide semiconductor.

11. The electronic implement replacement structure of claim 1, wherein the electronic module is a light emitting diode lamp, and the housing body further has a plurality of radiating fins disposed around the electronic module.

* * * * *